United States Patent [19]
Bien

[11] Patent Number: 5,105,165
[45] Date of Patent: Apr. 14, 1992

[54] LOW DISTORTION, LOW NOISE, AMPLIFIER

[75] Inventor: David E. Bien, Glendale, Ariz.

[73] Assignee: AT&T Bell Laboratories, Murray Hill, N.J.

[21] Appl. No.: 628,778

[22] Filed: Dec. 17, 1990

[51] Int. Cl.[5] ............................................. H03F 1/26
[52] U.S. Cl. .................................... 330/149; 328/162
[58] Field of Search ................. 330/149, 151; 328/162

[56] References Cited

U.S. PATENT DOCUMENTS 3,813,559  5/1974  De Boer .............................. 330/149
4,481,483  11/1984  Kawamura .......................... 330/149

OTHER PUBLICATIONS

"Radio Receiving Principles", *The 1987 ARRL Handbook for the Radio Amateur*, 1987, Chapter 12, pp. 12-12 through 12-15.

"The RF Amplifier", *Solid State Radio Engineering*, Herbert L. Krauss and Charles W. Bostian and Frederick H. Raab, Copyright 1980 by John Wiley & Sons, Inc., pp. 268 through 269.

"Analog Multipliers Employing the Bipolar Transistor, Nonlinear Analog Circuits", *Analysis and Design of Analog Integrated Circuits*, Second Edition, Paul R. Gray, Robert G. Meyer, Copyright 1977, 1984 by John Wiley & Sons, Inc., pp. 595 through 600.

Primary Examiner—Eugene R. LaRoche
Assistant Examiner—Tan Dinh
Attorney, Agent, or Firm—S. W. McLellan

[57] ABSTRACT

A bipolar or field-effect transistor amplifier with very large dynamic range for use as a preamplifier in a radio receiver, optical link reciver, or the like. The amount of gain is approximately an integral number. Diode-connected transistors in the collector load circuitry of a gain-providing transistor cancel the distortion from the non-linear effects of the emitter-base junction of the gain-providing transistor at high input signal levels. The number of diodes corresponds to the amount of gain desired. To reduce the noise generated by the amplifier, the emitter of the gain-providing transistor has an inductor in series therewith and the collector load circuitry has an inductor therein, the ratio of the inductances substantially determining the gain of the amplifier.

5 Claims, 2 Drawing Sheets

LOW DISTORTION, LOW NOISE, AMPLIFIER

BACKGROUND OF THE INVENTION

1. Field of the Invention

This invention relates to amplifiers in general and, more particularly, to low distortion amplifiers using distortion cancellation techniques.

2. Description of the Prior Art

In the radio art, it is generally the case that the useful sensitivity of a receiver is determined by the front end of the receiver—the mixer stage and preamplifier, if any. The useful sensitivity of any receiver has an upper and lower bound—defined here as the dynamic range of the receiver. The noise generated by the receiver (internal noise) determines the weakest signal that can be received, typically referred to as the minimum discernible signal or the minimum signal which produces a specified signal-to-noise ratio in the receiver's output signal. Conversely, the overload characteristics of the receiver determines the maximum received signal strength that can be received without a predetermined amount of distortion in the receiver output signal. It is generally considered desirable to have a receiver that has high sensitivity without overloading in high signal strength environments—i.e., a receiver with very wide dynamic range.

To increase the sensitivity of a receiver, a preamplifier is added between the antenna and the mixer portion of the receiver. The preamplifier serves to boost weak input signals to overcome the internal noise of the receiver, allowing the receiver to receive weaker signals than without a preamplifier. However, should a strong signal enter the receiver, non-linearities in the transfer characteristics of the preamplifier will add distortion products to the amplified signal. Further, should some strong, unwanted, signals be present in the passband of the receiver, the desired signal will be corrupted by the unwanted signals due to the distortion of the preamplifier—typically referred to as cross-modulation. A remedy that will reduce the gain of the preamplifier when strong signals are present is adding automatic gain control (AGC, typically derived from within the receiver) to control the gain of the preamplifier. However, AGC may not be desirable in all situations, such as in rapidly changing signal strength environments or if the reduction in gain of the preamplifier is so much that the signal-to-noise ratio of the desired signal is no longer sufficient. Another approach is to use active elements and preamplifier circuit configurations which can tolerate large signals without significant distortion and still provide the desired gain with low noise. For example, field-effect transistors have very good overload characteristics, compared to bipolar transistors, when operating class A either with a common source (emitter) or gate (base) configuration. However, depending on the frequency of interest, the gain and noise characteristics of field-effect transistors may not be as good as bipolar transistors.

Selection of the active devices to be used in preamplifier is especially difficult in ultra- and super-high frequency applications. For example, with cellular telephone systems where the operating frequency is approximately one GHz, silicon field-effect transistors do not have sufficient gain and low noise for use as receiver preamplifiers. Using gallium arsenide field-effect transistors instead of silicon devices will achieve the desired gain and noise as well as good overload characteristics, but suffer from relative high cost and the impracticality of integration with other circuit components, such as a mixer, which are typically formed on a silicon substrate for low cost. But for the relatively poor overload characteristics of bipolar transistors when operated conventionally, the ruggedness, low noise, low cost, high gain, and integratability of bipolar transistors would be a good choice for receiver preamplifiers.

Generally, the foregoing is also true for optical receivers. Preamplifiers boost the signal from an optical detector, typically a PIN diode, prior to further signal processing. While the preamplifier is generally necessary for long-haul systems where the received signal energy is weak, in short-haul systems where the received signal is strong, the preamplifier may cause received signal distortion, making the system unusable. It is generally disadvantageous to have two types of receivers (or manually adjust one type) depending on optical signal level received.

SUMMARY OF THE INVENTION

It is one aspect of the invention to provide an amplifier having predetermined gain with low distortion at high input signal strengths.

It is a further aspect of the invention to provide the low distortion amplifier with a low noise figure to provide very wide dynamic range for receiver preamplifier or the like in radio or optical receivers.

These and other aspects of the invention are provided for generally by an amplifier disclosed herein, disposed in an integrated circuit, having an input port and an output port, for providing a predetermined voltage gain. Said amplifier is characterized by a gain transistor, with an input terminal and two output terminals, the input terminal coupling to the input port and a first one of the output terminals coupling to the output port; and, a means for generating a signal substantially equal to the distortion generated by the gain transistor, coupled between the first one of the output terminals of the gain transistor and a first power supply rail. The distortions created by the gain transistor are substantially reduced by the means.

The above aspects of the invention may also be obtained generally by a method of amplifying signals with reduced distortion. The steps are: 1) amplifying the signals applied to the input port with a gain transistor, the gain transistor having an input terminal and two output terminals, the input terminal coupling to the input port and a first one of the output terminals coupling to the output port; and, 2) substantially canceling distortion from the gain transistor with means for generating a signal substantially equal to the distortion generated by the gain transistor, coupled between the first one of the output terminals of the gain transistor and a first power supply rail.

BRIEF DESCRIPTION OF THE DRAWING

The foregoing features of this invention, as well as the invention itself, may be more fully understood from the following detailed description of the drawings, in which.

DETAILED DESCRIPTION

The present invention reduces the amount of distortion generated by an amplifier, particularly at high input signal levels, while keeping the noise generated by the amplifier low. Briefly, this is shown in the exemplary embodiment of FIG. 2. As shown, a means for generating a signal substantially equal to the distortion generated by gain transistor 13, here a plurality of diode-connected transistors $16_1$–$16_N$ serially coupled to the collector of a gain providing transistor 13, substantially cancel the distortion from the gain transistor 13. The ratio of the impedance of the load impedance 17 (here an inductor) to the impedance of degeneration impedance 15 (also an inductor) substantially determines the gain of the amplifier 4. It is preferable that the gain of the amplifier 4 be an integer and the number of diode-connected transistors $16_1$–$16_N$ be substantially equal to the gain of the amplifier 4.

Figure 1:
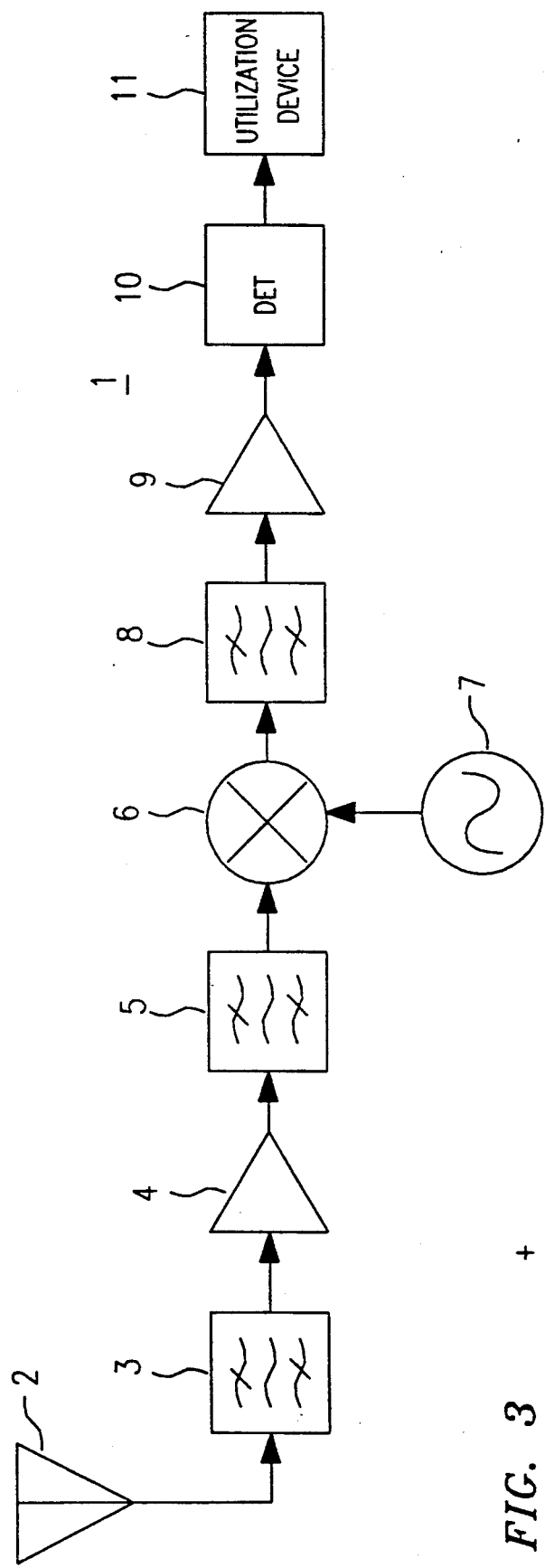
FIG. 1 is a simplified block diagram of a typical superheterodyne radio receiver.

In FIG. 1, a typical, exemplary, superheterodyne receiver 1 is shown in a simplified block diagram. Signals received by antenna 2 pass through a first bandpass filter 3 to the input of preamplifier 4. The filter 3 is typically used to suppress signals, having frequencies outside the desired frequency band, from reaching the preamplifier 4. This filter, along with filter 5, are important in blocking signals having frequencies near the image frequency response of the receiver 1. The signals from the output of preamplifier 4 pass through filter 5 to mixer 6 where the desired signal is mixed with a carrier signal from oscillator 7. The desired signal is translated in frequency both down and up by the carrier signal, one of which is selected by intermediate frequency (IF) filter 8 and amplified by IF amplifier 9. The amplified signal from amplifier 9 is demodulated (or mixed with another carrier signal, filtered, and amplified one or more times in multiple conversion superheterodyne receivers) by detector 10, the demodulated result (receiver output) being sent to utilization device 11.

As discussed above, the preamplifier 4 amplifies weak signals to a level which would otherwise be insufficient to overcome internal noise from the receiver and make the demodulated signal to the utilization device 11 useful. However, adding a preamplifier decreases the maximum received signal level that can be tolerated before distortion reduces the quality of the receiver output, the demodulated result sent to the utilization device 11, below a useful level. In addition, the non-linearities in the preamplifier 4 can cross-modulate the desired, relatively weak, signal by strong adjacent signals applied to the input of the preamplifier 4. The cross-modulation of the desired signal can reduce the quality of the receiver output below a useful level—even though the signal strength of the strong adjacent signal is less than the maximum that can be tolerated in the single-signal case.

Figure 2:
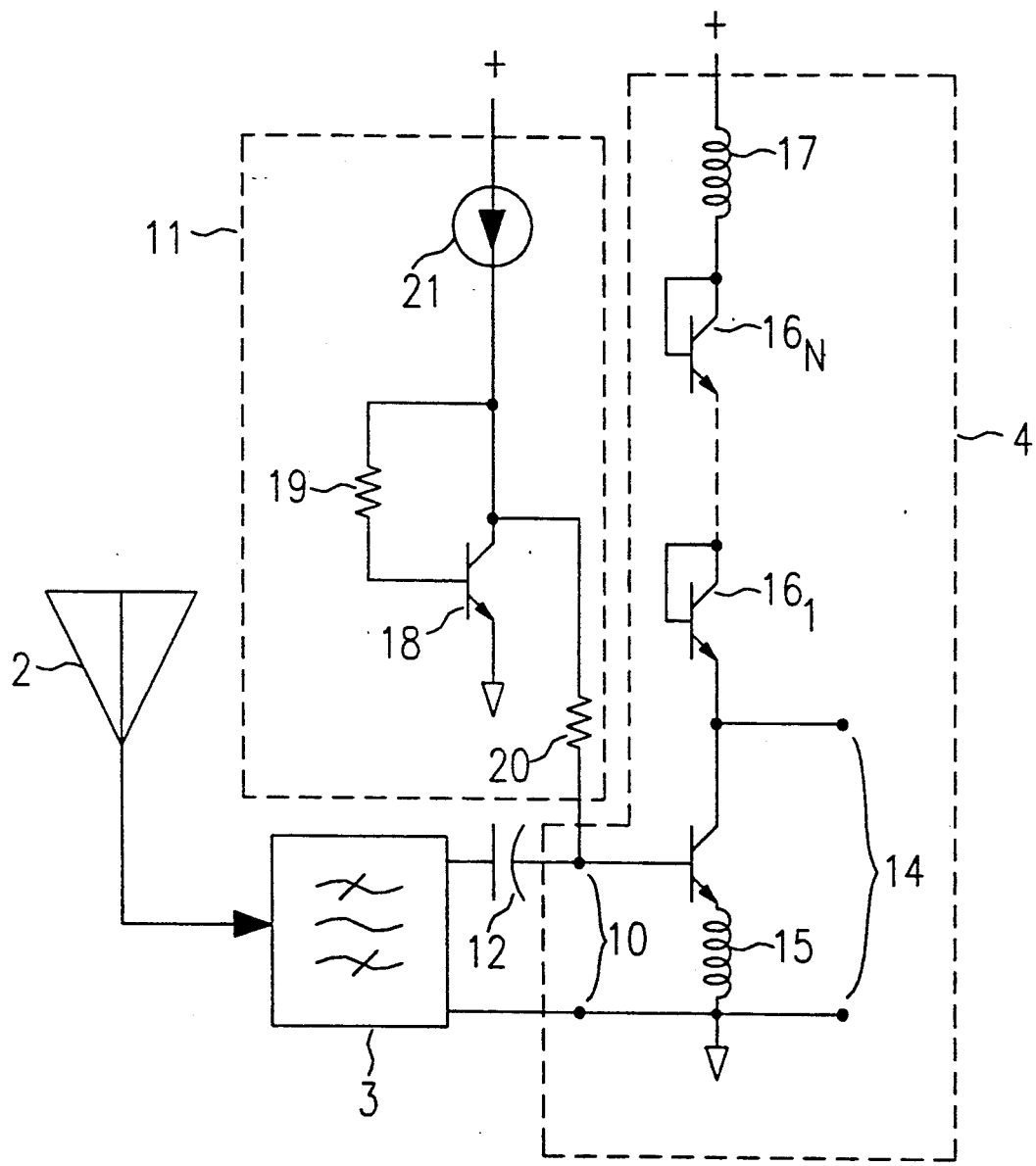
FIG. 2 is a simplified schematic of the preamplifier according to one embodiment of the invention; and, FIG. 3 is a simplified block diagram of a typical optical link receiver.

A receiver utilizing as a preamplifier 4 the amplifier 4 shown in FIG. 2 will typically be less susceptible to cross-modulation than receivers using conventional preamplifiers. The comparison is valid, for example, between the amplifier 4 in FIG. 2, implemented with bipolar transistors in a common emitter configuration, and a conventional amplifier implemented with bipolar transistors in a common emitter configuration. Similarly, the comparison is generally valid when the active devices are all field-effect transistors with similar device configuration.

The amplifier 4 of FIG. 2 has an input port 10 coupled to a bandpass filter 3, similar to that shown in FIG. 1, which suppresses received signals, from antenna 2, outside the desired frequency band of interest. Also shown is a DC biasing means 11, which will be discussed in more detail below, used to bias the amplifier 4 to the desired operating point. Capacitor 12 serves as a DC blocking capacitor to prevent the bias currents from biasing means 11 from entering the filter 3.

A gain providing transistor 13, here in a common emitter configuration, has the base thereof coupling to the input port 10. The collector of transistor 13 couples to the output port 14, which will in turn couple to filter 5 (FIG. 1). The emitter of transistor 13 couples to a degeneration impedance 15, here an inductor, which in turn couples to a common point and power supply return, here ground. It is noted that the input port 10 and output port 15 are also referenced to ground. The value of the impedance 15 will be discussed in detail below. The collector of transistor 13 also couples to one end of a string of series-coupled, diode-connected, transistors $16_1$–$16_N$, the purpose of which will be discussed below. The other end of the diode-connected transistors $16_1$–$16_N$ couples to a load 17 (here an inductor) which, with the transistors $16_1$–$16_N$, forms the load for the gain transistor 13.

The overall voltage gain of the amplifier 4 is substantially established by the ratio of the impedance of the load 17 to the impedance of degeneration impedance 15. Preferably, the load 17 and degeneration impedance 15 are inductors instead of resistors since pure inductors do not contain noise sources contributing to the noise figure of the amplifier. It is understood that resistors may be substituted or the load 17 and degeneration impedance 15, but the noise generated therefrom may be substantial, degrading the performance of the amplifier 4. It is further noted that the degeneration impedance 15 may be formed by using the parasitic inductance of the wiring between the emitter of transistor 13 and ground. However, the parasitic inductance of the transistors $16_1$–$16_N$ and the wiring to the collector of transistor 13 must be taken into account when determining the inductance of load 17.

It is believed that the diode-connected transistors $16_1$–$16_N$ substantially cancel the signal distortions caused by the gain transistor 13. For example, distortions caused by the non-linear characteristic of the base-emitter junction of transistor 13, and amplified by the transistor 13, are compensated for by the series of diode-connected transistors $16_1$–$16_N$. Hence, the number of diodeconnected transistors $16_1$–$16_N$ should be approximately equal to the desired voltage gain of the amplifier 4. It is, therefore, preferable that the desired voltage gain of the amplifier 4 be an integral number, N. As such, the impedance of the load 17 should be N times the impedance of the degeneration impedance 15. It is also preferable that the electrical characteristics of the diode-coupled transistors $16_1$–$16_N$ be substantially the same as the electrical characteristics of the gain transistor 13. Moreover, the current density in all the transistors 13, $16_1$–$16_N$ should be substantially the same. This may be achieved by scaling the transistors $16_1$–$16_N$ so that the current densities therein are substantially the same as that in transistor 13. However, because the gain of transistor 13 is large, the size of all transistors may be the same with little resulting difference in current densities in each.

The bias means 11 supplies a temperature compensated current to properly bias transistor 13. To provide the desired temperature compensation, transistor 18, diode connected via resistor 19, is preferably sized to have substantially identical current density therein as transistor 13 and is disposed in the same integrated circuit as transistor 13. Current from the means 11 passes through resistor 20 which serves to decouple the transistor 18 from the input port 10 of the amplifier 4. As a result, the current from current source 21 determines the substantially temperature-independent collector current in transistor 13.

EXAMPLE

The amplifier 4 has been constructed for use as a preamplifier with a voltage gain of 2(N=2) in a digital receiver operating at a receiving frequency of about 1 GHz. The typical component values are given below:

transistors 13, 16, 16$_2$, 18—1.5×96 $\mu$m emitter size, $f_T \approx$ 12 GHz.
transistor 18—1.5×24 $\mu$m
impedance 15—5 nH
impedance 17—10 nH
resistor 19—4K $\Omega$
resistor 20—1K $\Omega$
current source 21—1 mA It is noted that field-effect transistors (FETs) may be substituted for the bipolar transistors shown. Further, while the polarity type of the transistors 13, 16$_1$–16$_N$ and 18 are shown here as NPN, PNP transistors may be used instead.

Figure 3:
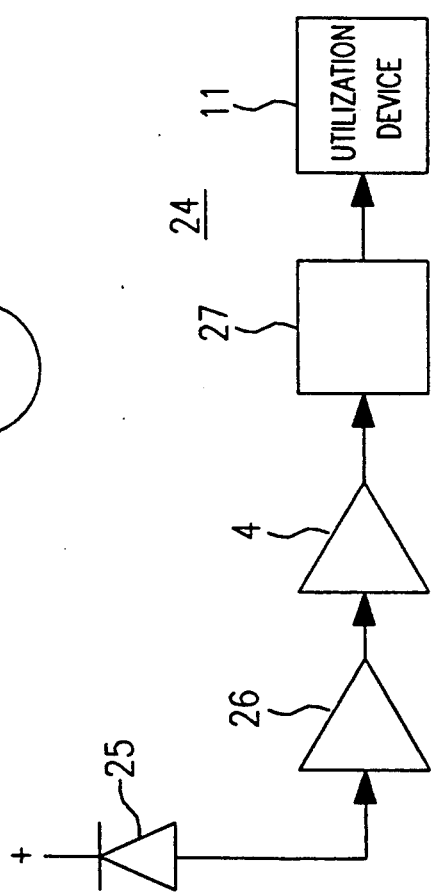

Another use for the amplifier 4 of FIG. 2 is as an amplifier, used in conjunction with a transimpedance amplifier 25, for an optical link receiver 24, as shown in FIG. 3. Here, optical signals received from an optical transmitter (not shown) are converted into electrical signals by an electro-optical device 25, such as a PIN diode. The electrical signal is first converted from a current to a voltage by a transimpedance amplifier 26. The signal from transimpedance 26 amplifier may then be amplified by an amplifier 4 prior to further processing by a signal processor 27, such as a slicer for digital data or filtering and further amplification for analog signals. The output of the signal processor 27 is then applied to the utilization device 11. As in the case with the radio receiver 1 in FIG. 1, the gain, distortion, and noise contribution of the transimpedance amplifier 26 and amplifier 4 can define the ultimate performance of the optical receiver 24. For the receiver 29 to have the same sensitivity without amplifier 4, the gain of transimpedance amplifier 26 must be increased, decreasing the bandwidth thereof. Hence, utilizing the exemplary amplifier 4 shown in FIG. 2 may improve the performance of the receiver 24 beyond that possible with just a transimpedance amplifier 26.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. An amplifier, disposed in an integrated circuit, having an input port and an output port, for providing a predetermined voltage gain,
    a gain transistor, with an input terminal and two output terminals, the input terminal coupling to the input port and a first one of the output terminals coupling to the output port;
    a plurality of series coupled, diode-connected transistors, coupled between the first one of the output terminals of the gain transistor and a first power supply rail;
    a first impedance element, for providing a negative feedback and having a predetermined impedance, coupled between a second output of the gain transistor and a second power supply rail; and,
    a second impedance element, having an impedance approximately N times that of the first impedance element, coupled in series with the plurality of series coupled, diode-connected transistors;
    wherein distortions created by the gain transistor are substantially reduced by the plurality of series coupled, diode-connected transistors, and the predetermined gain of the amplifier is approximately N.

2. The amplifier as recited in claim 1, wherein the number of diode-connected transistors is N.

3. The amplifier as recited in claim 2, wherein the gain transistor and the diode-connected transistors are bipolar transistors.

4. The amplifier as recited in claim 3, wherein the impedance elements are inductors.

5. The amplifier as recited in claim 4, wherein the current density in the gain transistor is substantially the same as the current density in each of the diode-connected transistors.

* * * * *